(12) United States Patent
Howard

(10) Patent No.: US 9,325,343 B2
(45) Date of Patent: Apr. 26, 2016

(54) SYSTEMS AND METHODS FOR COMPRESSION OF HIGH-FREQUENCY SIGNALS

(75) Inventor: Brian F. Howard, Issaquah, WA (US)

(73) Assignee: General Electric Company, Schenectady, NY (US)

( * ) Notice: Subject to any disclaimer, the term of this patent is extended or adjusted under 35 U.S.C. 154(b) by 927 days.

(21) Appl. No.: 13/409,930

(22) Filed: Mar. 1, 2012

(65) Prior Publication Data

US 2013/0229206 A1   Sep. 5, 2013

(51) Int. Cl.
*H03K 5/00* (2006.01)
*H03M 7/30* (2006.01)

(52) U.S. Cl.
CPC .......... *H03M 7/3059* (2013.01); *H03M 7/3064* (2013.01)

(58) Field of Classification Search
CPC .................................................... H03M 7/3059
See application file for complete search history.

(56) References Cited

U.S. PATENT DOCUMENTS

| | | | |
|---|---|---|---|
| 4,003,002 A | 1/1977 | Snijders et al. | |
| 4,353,096 A | 10/1982 | Sakurai | |
| 6,470,757 B2 | 10/2002 | Chang | |
| 6,720,999 B1 * | 4/2004 | Holberg | H04N 5/23241 333/14 |

FOREIGN PATENT DOCUMENTS

| | | |
|---|---|---|
| DE | 2940487 A1 | 4/1980 |
| EP | 0798866 A2 | 10/1997 |
| EP | 1104196 A2 | 5/2001 |

OTHER PUBLICATIONS

Translation of DK Office Action issued Oct. 10, 2014 in relation to corresponding application PA201370108.

* cited by examiner

*Primary Examiner* — Daniel Puentes
(74) *Attorney, Agent, or Firm* — Armstrong Teasdale LLP

(57) ABSTRACT

Systems and methods for compressing high-frequency signals are described in certain embodiments herein. According to certain embodiments, a high-frequency signal can be converted into a lower frequency signal so that it can be processed by one or more devices in a lower frequency infrastructure. In certain embodiments, the high-frequency signal can be compressed by certain signal conditioning components and an algorithm executed by a computer processor to at least receive a high-frequency signal, correct the high-frequency signal, determine a number of samples to be taken from the high-frequency signal (i.e., sample the high-frequency signal), store a value associated with the sampled signal, and generate a waveform that includes lower frequency content that may represent the original, high-frequency signal.

7 Claims, 5 Drawing Sheets

SYSTEMS AND METHODS FOR COMPRESSION OF HIGH-FREQUENCY SIGNALS

TECHNICAL FIELD

Embodiments herein relate generally to signal processing and more particularly to compressing content in high-frequency signals.

BACKGROUND OF THE INVENTION

Various measurement systems and equipment can capture content from high-frequency signals. Processing such signals, however, can require a dedicated and specialized infrastructure including special wiring, high-speed data acquisition devices, and large storage devices. Such an infrastructure can be costly to build and maintain each time high-frequency signals require processing. More conventional infrastructures that may be unable to process high-frequency signals have not been fully leveraged to provide a more diverse, cost-effective alternative.

BRIEF DESCRIPTION OF THE INVENTION

Some or all of the above needs and/or problems may be addressed by certain embodiments of the invention. Certain embodiments may include systems, methods, and apparatuses for compressing high-frequency signals. According to one embodiment, there is disclosed an apparatus including: a switch, configured to receive at least one compressed signal, wherein the at least one compressed signal is created in part by compressing at least one measured signal; a modulator, coupled to the switch, configured to modulate the at least one compressed signal; a filter, coupled to the modulator, configured to filter the at least one measured signal; at least one memory, coupled to the modulator, configured to store the at least one compressed signal; and a control interface, coupled to at least one of the switch, the modulator, the filter, or the at least one memory, configured to control at least one of the switch, the modulator, the filter, or the at least one memory to compress the at least one measured signal.

According to another embodiment, there is disclosed a system including at least one memory that stores computer-executable instructions, and at least one processor configured to access the at least one memory, wherein the at least one processor is configured to execute the computer-executable instructions to receive a signal, correct the signal, determine a number of samples to be collected from the corrected signal, store a maximum value of the corrected signal for each of a plurality of packets, and generate a waveform based at least in part on the maximum value stored for each of the plurality of packets.

According to a further embodiment, there is disclosed a method for receiving, from a monitored machine, a high-frequency signal of at least approximately 100 kHz, correcting the high-frequency signal by recording only a predefined portion of the high-frequency signal, determining a number of samples to be collected from the corrected high-frequency signal, dividing the high-frequency signal into a plurality of packets based at least in part on the number of samples, storing a maximum value of the corrected high-frequency signal for each of the plurality of packets, and generating a waveform based at least in part on the maximum value stored for each of the plurality of packets.

Other embodiments, systems, methods, apparatuses, aspects, and features of the invention will become apparent to those skilled in the art from the following detailed description, the accompanying drawings, and the appended claims.

BRIEF DESCRIPTION OF THE FIGURES

The detailed description is set forth with reference to the accompanying drawings, which are not necessarily drawn to scale. The use of the same reference numbers in different figures indicates similar or identical items.

DETAILED DESCRIPTION OF THE INVENTION

Figure 1:
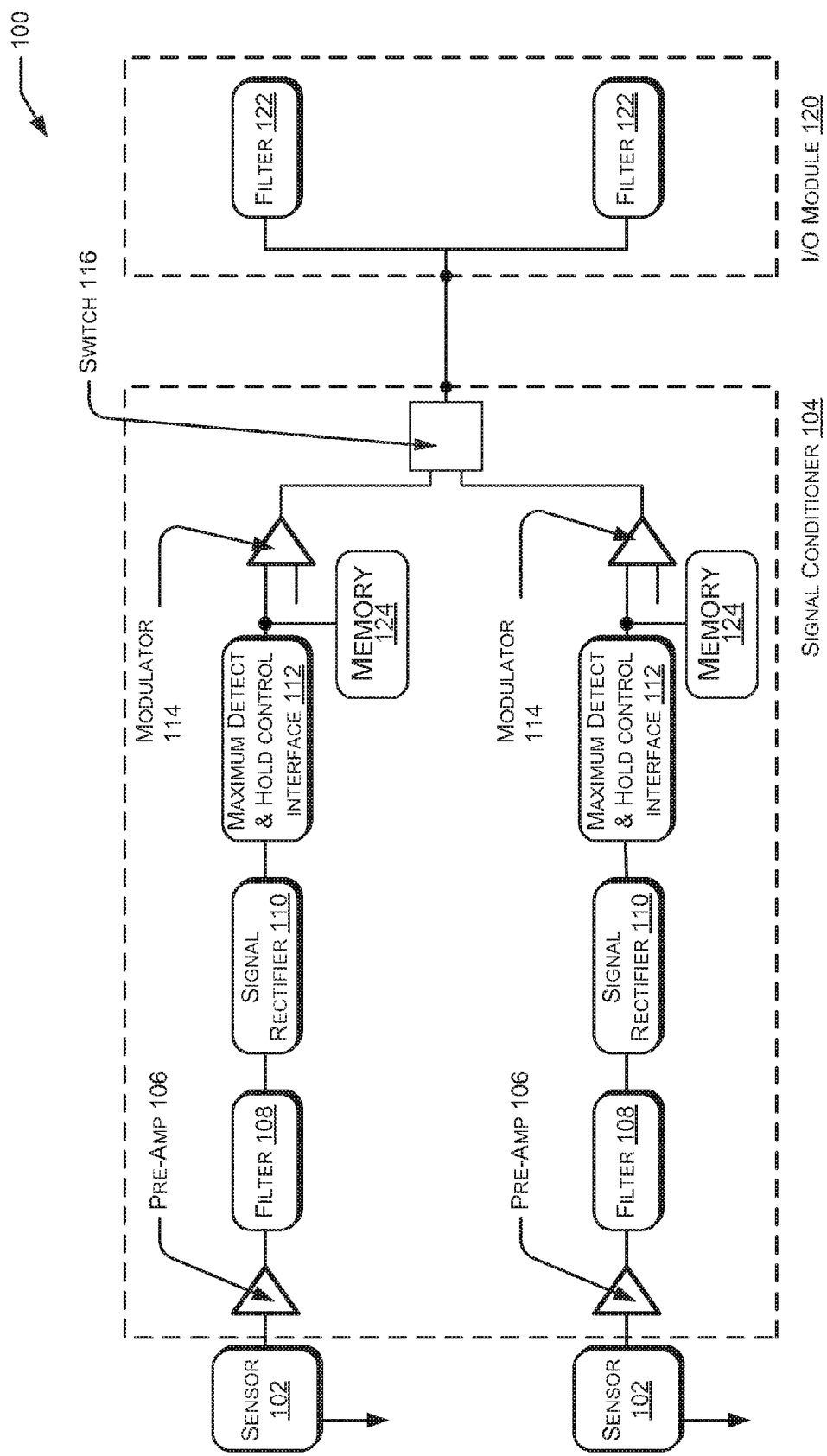
FIG. 1 is a block diagram of an apparatus including, but not limited to, signal conditioning components for compressing high-frequency signals, according to one embodiment.

Illustrative embodiments will now be described more fully hereinafter with reference to the accompanying drawings, in which some, but not all embodiments of the invention are shown. The invention may be embodied in many different forms and should not be construed as limited to the embodiments set forth herein; rather, these embodiments are provided so that this disclosure will satisfy applicable legal requirements.

Illustrative embodiments of the invention are directed to, among other things, compression of high-frequency signals. As used herein, a signal may be considered a high-frequency signal if it is greater than or equal to about 100 KHz. Compressing a high-frequency signal can refer generally to converting the high-frequency signal to a lower frequency signal, i.e., a signal lower than about 100 KHz. Certain embodiments herein are directed to compressing high-frequency signals into lower frequency signals so that they can be used by infrastructures that can process lower frequency signals but not high-frequency signals, i.e., lower frequency infrastructures as used herein. For example, certain input/output (IO) devices, such as monitors and wires connecting such devices to various high-frequency systems, may be unable to receive and process high-frequency signals in their original form.

Compression of high-frequency signals can be performed using various systems and components in certain embodiments herein. As an overview, a computer system executing computer-instructions may compress a high-frequency signal. The computer system can receive a high-frequency signal, such as an ultrasonic wave, and correct the signal for further processing. For example, the high-frequency signal can be amplified to increase the resolution of the high-frequency signal. The computer system may also filter the high-frequency signal to keep data for certain frequencies. The signal can be further rectified so that peak levels along the sinusoidal waveform representing the high-frequency signal can be captured, according to one embodiment.

In one embodiment, after the high-frequency signal has been corrected, the computer system can determine a rate at which to sample the high-frequency signal. A maximum value for each sample taken can be stored and used to create an amplitude modulated waveform that may represent the original high-frequency signal as a lower frequency signal. The generated waveform can be sent over a field wire to an IO device, both in a lower frequency infrastructure, where it can be processed or analyzed. Prior to compressing the high-frequency signal as described above, the field wire and IO device would have been unable to handle the high-frequency signal, according to certain embodiments. The computer system can also combine multiple, compressed high-frequency signals into a single lower frequency signal and send the combined signal to a lower frequency infrastructure. Certain embodiments herein also describe an apparatus that can also implement the compression of high-frequency signals described above.

The technical effects of certain embodiments herein may be reduced costs associated with processing high-frequency signals in the way that relatively expensive infrastructures used to process such signals may not be necessary for all situations in which high-frequency signals need to be processed.

FIG. 1 depicts an apparatus that can be used to compress a high-frequency signal, according to one embodiment. The apparatus can include, but is not limited to, a signal conditioner 104, and an IO module 120. In one embodiment, the apparatus can be an analog-to-digital (AD) converter. The signal conditioner 104 can receive high-frequency signals from one or more sensors 102. The one or more sensors 102 can be associated with conditioning monitoring systems on rotating and reciprocating equipment, or other measurement systems equipment, as non-limiting examples. High-frequency signals can also be received from various other types of equipment that may generate high-frequency signals. In one embodiment, the apparatus can include, but is not limited to, components that may correct a high-frequency, process the corrected signal, and output a waveform in a lower frequency that may be representative of the original, high-frequency signal.

The signal conditioner 104 can include, but is not limited to, a maximum detect and hold control interface 112. In one embodiment, the maximum detect and hold control interface 112 can be coupled to one or more of a switch, a modulator, a filter, and at least one memory. Such an interface can control each of these components to compress one or more signals, such as signals received from measurement equipment, i.e., measured signals. In one aspect of an embodiment, the measured signal can be a high-frequency signal of at least about 100 KHz.

One or more pre-amplifiers 106, filters 108, and signal rectifiers 110 can be used to correct the measured signal, in one embodiment. According to this embodiment, the pre-amps 106 can amplify the measured signal to increase the resolution of the measured signal by, for example, increasing the signal-to-noise ratio. A filter 108 can be coupled to the modulator and configured to filter out invalid or unwanted data points from the measured signal. Exemplary filters can include, but are not limited to, a bandpass filter and a decimation bandwidth filter. The signal rectifier 110 can be configured to correct the measured signal by recording only a predefined portion of the signal, in one embodiment. In one aspect of the embodiment, the predefined portion of the measured signal can be a positive portion of the signal. The signal rectifier 110 can record other portions of a signal to correct the signal or otherwise prepare the measured signal for compression, in other embodiments.

In certain embodiments, the maximum detect and hold control interface 112 can implement a computer algorithm to compress a measured signal, such as a corrected high-frequency signal. In one embodiment, the computer algorithm can be implemented by a digital signal processor (DSP), which can receive computer-executable instructions for performing the compression in its firmware. The maximum detect and hold control interface 112 can determine a rate for acquiring digital samples from the corrected signal. A primary factor in such a determination can be the frequency at which a signal is desired to be modulated. The modulated frequency can depend on the infrastructure or equipment that may receive and process the modulated signal. For example, to process a signal modulated at about 20 KHz that may be representative of an original, high-frequency approximate 454 KHz signal, about twenty-three samples would need to be taken. The number of samples can be determined by dividing the original, high-frequency signal (about 454 KHz) by the desired frequency of the modulated signal (about 20 Hz).

Figure 2A:
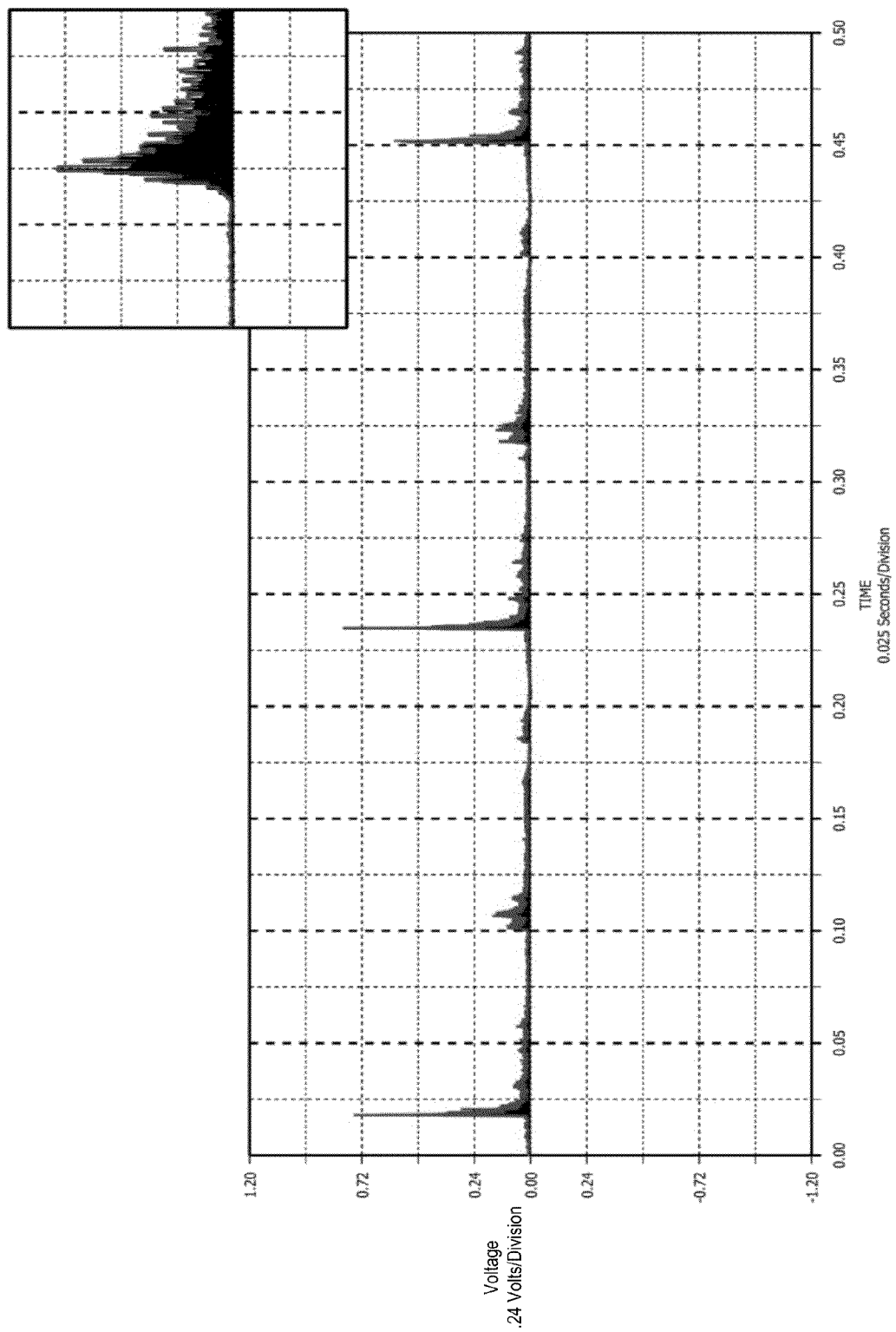
FIG. 2a is a graphical illustration of a high-frequency signal that is sampled according to certain embodiments herein.

Upon determining the number of samples to acquire, according to one embodiment, the maximum detect and hold control interface 112 can acquire the samples. The lighter-shaded portion of the exemplary signal in FIG. 2a represents the acquired samples, according to one example. In one embodiment, the lighter-shaded portion can have a length equal to the inverse of the sampling frequency, e.g., 20 KHz, times the number of samples, e.g., twenty-three. The maximum detect and hold control interface 112 can also store the acquired samples in a memory 124, which can be coupled to the modulator and configured to store the compressed signal. In one aspect of an embodiment, the maximum value of the acquired digital samples can be stored. In another aspect, the maximum value of the corrected signal for each of a plurality of packets can be stored.

Figure 2B:
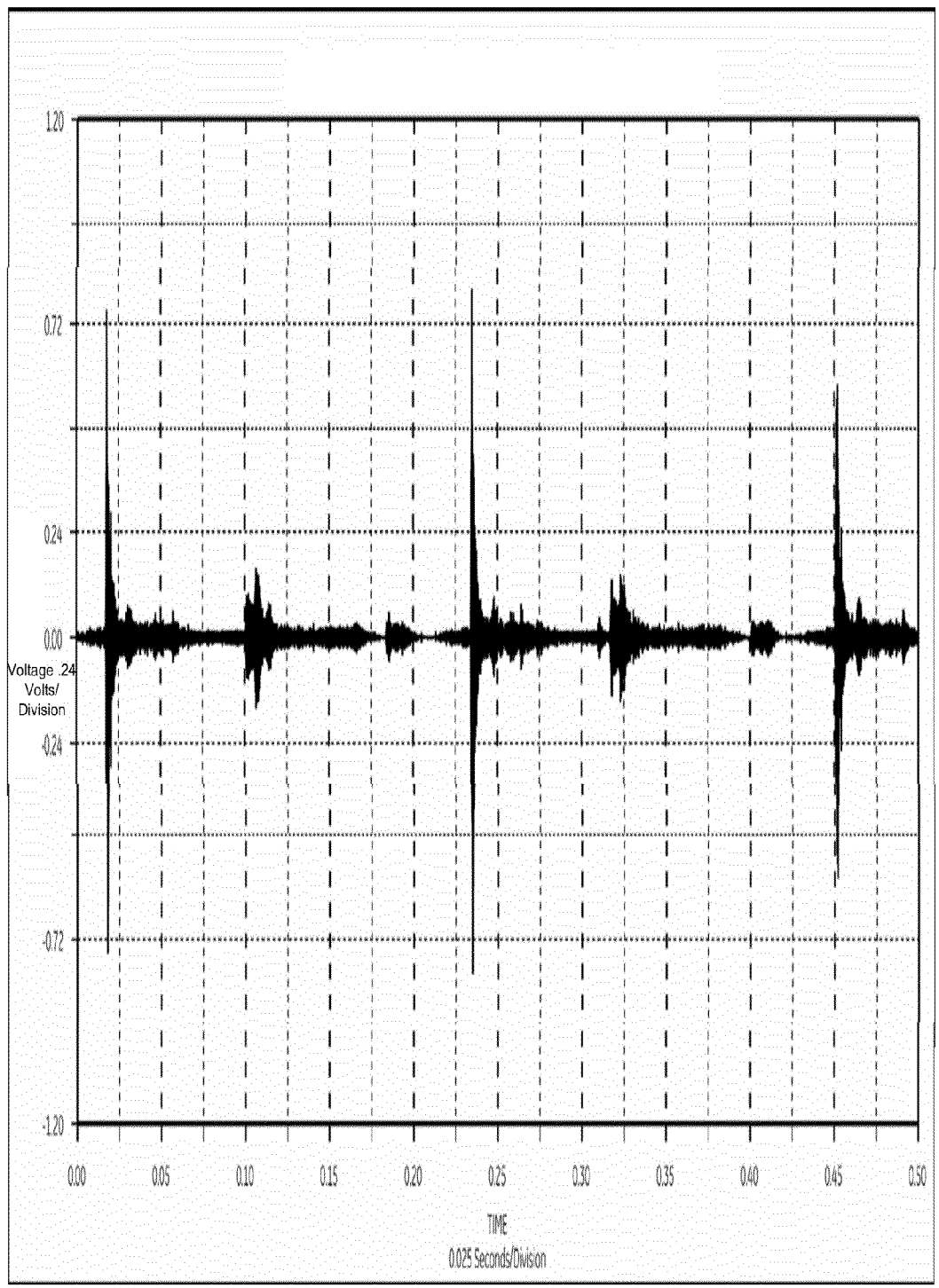
FIG. 2b is a graphical illustration of an exemplary waveform that may result from compressing a high-frequency signal, according to one embodiment.

The compressed signal, for example the compressed signal shown in FIG. 2b, can be further processed to make it suitable for receipt by a lower frequency infrastructure. Such an infrastructure may, in certain embodiments, require an analog signal. In one embodiment, the maximum detect and hold control interface 112 can "fill-in" the area underneath the compressed signal such that the compressed signal can include an amplitude modulated sinusoidal waveform, in one aspect of an embodiment. Such a waveform can be generated by the maximum detect and hold control interface 112 performing certain calculations on data from the compressed signal. The calculations can include, but are not limited to, determining a modulation for the waveform based on the sampling frequency. An exemplary waveform that can result from the calculations is shown in FIG. 2b. Such a waveform may be without high-frequency content and therefore can be used in certain lower frequency infrastructures.

In one embodiment, the algorithm implemented by the control interface 112 may be implemented in Microsoft® Visual Basic® for Applications (VBA), and the data may be stored in a format compatible with VBA, such as data exported from Microsoft® Excel® in Comma Separated Values (CSV) format. In other embodiments, various other programming languages and data formats can be used to implement the algorithm.

In one embodiment, the maximum detect and hold control interface 112 can also be configured to divide the compressed signal into at least two divisions that can be based at least in part on the determined number of samples collected from the corrected signal. In one aspect of an embodiment, an amount of the plurality of packets may be based at least in part on the at least two divisions. The maximum detect and hold control interface 112 can be further configured to store the generated waveform in memory 124 or output the generated waveform. For example, the generated waveform may be passed through a field wire to an IO module 120 in a lower frequency infrastructure by a modulator 114, which can be coupled to the switch and configured to modulate the compressed signal, e.g., in its sinusoidal wave form. The switch 116 can be configured to receive at least one compressed signal, which, according to one embodiment, can be created by compressing one or more measured signals. In certain embodiments, the switch 116 can be a multiple-input, single output switch, such as a multiplexing switch, which can combine compressed signals into a single signal before it is transmitted to an IO module 120 in a lower frequency infrastructure by the modulator 114. The filters 122 in the IO module 120 may be required to separate the combined signal at the IO module 122 before it can be processed, in some embodiments.

In certain embodiments, the process of compressing a high-frequency signal may introduce a timing error which reflects a lag between the compressed signal and the measured, high-frequency signal. In the above example, a timing error of about $6.3 \times 10^{-5}$ seconds may be introduced ((23 samples*1.25)/454 KHz, where 1.25 is a factor and 454 KHz is the approximate frequency of the high-frequency signal. According to certain embodiments, such an error or less can be acceptable.

Figure 3:
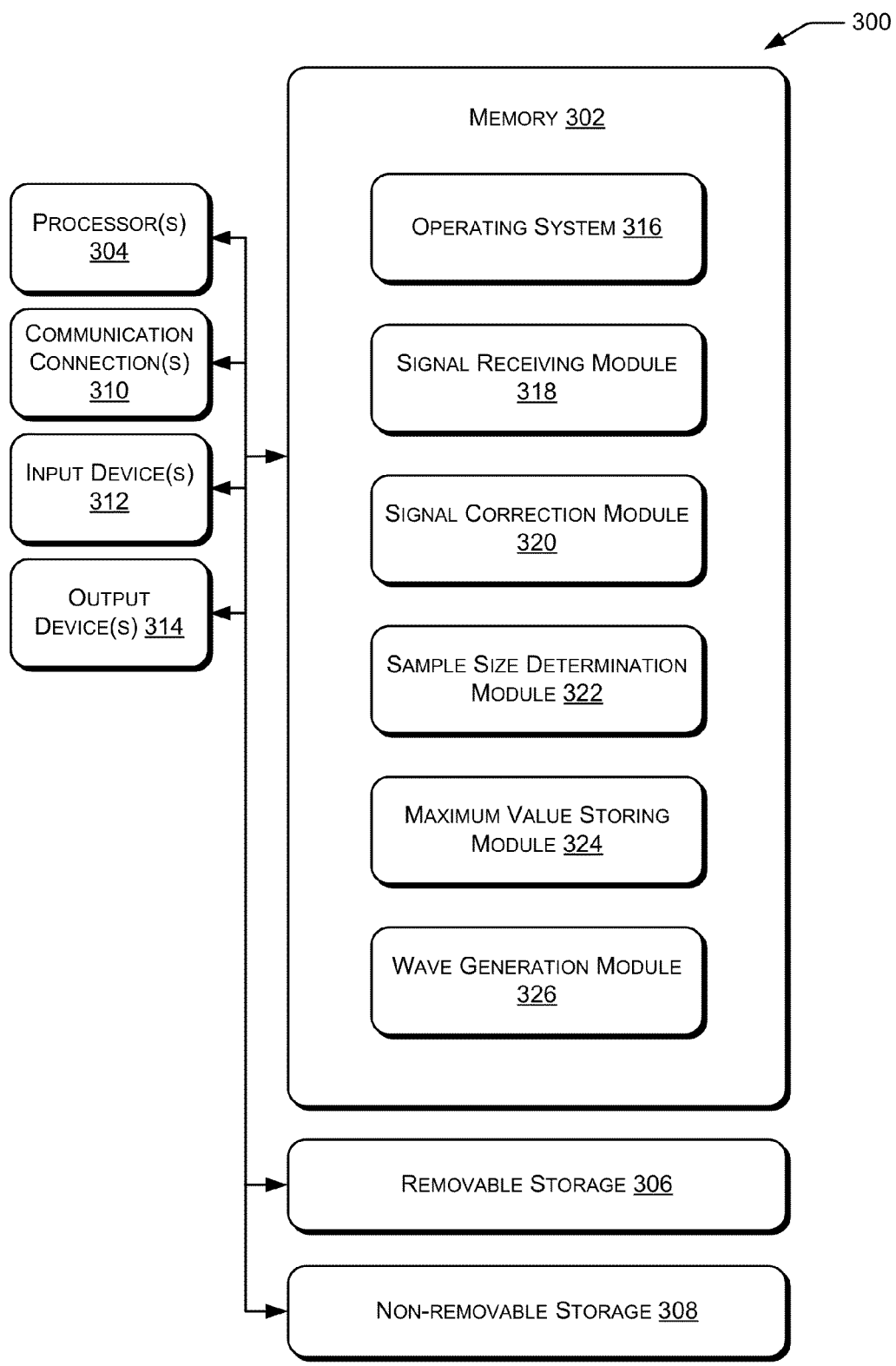
FIG. 3 is a block diagram of an exemplary computing environment for compressing high-frequency signals, according to one embodiment.

FIG. 3 depicts a block diagram of an exemplary computing environment for compressing a high-frequency signal. The computing environment 300 can include a computing device, which can include a processor 304 capable of communicating with a memory 302. The processor 304 can be implemented as appropriate in hardware, software, firmware, or combinations thereof. Software or firmware implementations of the processor 304 may include computer-executable or machine-executable instructions written in any suitable programming language to perform the various functions described. Examples of computing devices may include a personal computer, mainframe, web server, mobile device, or any processor-based device capable of executing instructions to perform the functions described in embodiments herein.

A memory 302 can store program instructions that are loadable and executable on the processor 304, as well as data generated during the execution of these programs. Depending on the configuration and type of computing environment 300, a memory 302 may be volatile (such as random access memory (RAM)) and/or non-volatile (such as read-only memory (ROM), flash memory, etc.). The computer device may also include additional removable storage 306 and/or non-removable storage 308 including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 302 may include multiple different types of memory, such as static random access memory (SRAM), dynamic random access memory (DRAM), or ROM.

The memory 302, removable storage 306, and non-removable storage 308 are all examples of computer-readable storage media. For example, computer-readable storage media may include volatile and non-volatile, removable and non-removable media implemented in any method or technology for storage of information such as computer-readable instructions, data structures, program modules or other data. Additional types of computer storage media that may be present include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile discs (DVD) or other optical storage, magnetic cassettes, magnetic tapes, magnetic disk storage or other magnetic storage devices, or any other medium which can be used to store the desired information and which can be accessed by the computer device. Combinations of any of the above should also be included within the scope of computer-readable media.

In other embodiments, however, computer-readable communication media may include computer-readable instructions, program modules, or other data transmitted within a data signal, such as a carrier wave, or other transmission. As used herein, however, computer-readable storage media does not include computer-readable communication media.

The computing environment 300 may also include one or more communication connections 310. In one embodiment, the connections 310 can allow the computer device to receive data from one or more sensors that receive content in high-frequency signals. The connection between the computer device and equipment may be wired or wireless, according to various embodiments. The computing environment 300 can also include one or more input devices 312, such as a keyboard, mouse, pen, voice input device, and touch input device. It may also include one or more output devices 314, such as a display, printer, and speakers.

Turning to the contents of the memory 302 in more detail, the memory 302 can include, but is not limited to, an operating system 316 and one or more application programs or services for implementing the features and aspects disclosed herein, including a signal receiving module 318, a signal correction module 320, a sample size determination module 322, a maximum value storing module 324, and a wave generation module 326.

The signal receiving module 318 can receive a signal, such as a high-frequency signal of at least about −100 KHz, in one aspect of an embodiment. The signal can be corrected by the signal correction module 320. Correction of the signal can include amplifying the signal to increase the resolution of the signal. The amplification can be similar to that performed by the pre-amps 106 in FIG. 1 described above. Correction of a signal can also include filtering the signal to remove invalid or unwanted data points. The filtering can be similar to that performed by the filter 108, according to one embodiment. Correction of the high-frequency signal can further include recording only a predefined portion of the signal, in similar fashion to that performed by the signal rectifier 110 in one embodiment. In one aspect of the embodiment, the predefined portion of the signal can be the positive portion of the signal.

Upon correcting the signal, the sample size determination module 322 can determine a number of samples to be collected from the corrected signal. In one embodiment, the number of samples can be determined based on a desired frequency at which to modulate the signal. In one embodiment, the sample size determination module 322 can also divide the signal into at least two divisions that can be based at least in part on the determined number of samples that may be collected from the corrected signal.

The maximum value storing module 324 can store the corrected signal in a memory, for example. According to various embodiments, different representations of the signal can be stored. In one embodiment, the maximum value of the corrected signal for a plurality of packets can be stored. An amount of the plurality of packets can be based on the at least two divisions of the signal, in one aspect of an embodiment. The maximum value for the plurality of packets can be used to generate a waveform, e.g., an amplitude modulated sinusoidal waveform generated by the waveform generation module 326. The waveform generation module 326 can also store and/or output the generated waveform, in one aspect of an embodiment.

While the embodiment in FIG. 3 describes a computer device with a memory 302 including various modules, one will recognize that certain functionality associated with the computer device can be distributed to any number and combination of computer or processor-based devices in accordance with other embodiments. Various instructions, methods, and techniques described herein may be considered in the general context of computer-executable instructions, such as program modules, executed by one or more computers or other devices. Generally, program modules include routines, programs, objects, components, data structures, etc., for performing particular tasks or implementing particular abstract data types. These program modules and the like may be executed as native code or may be downloaded and executed, such as in a virtual machine or other just-in-time compilation execution environments. Typically, the functionality of the program modules may be combined or distributed as desired in various embodiments. An implementation of these modules and techniques may be stored on some form of computer-readable storage media.

Figure 4:
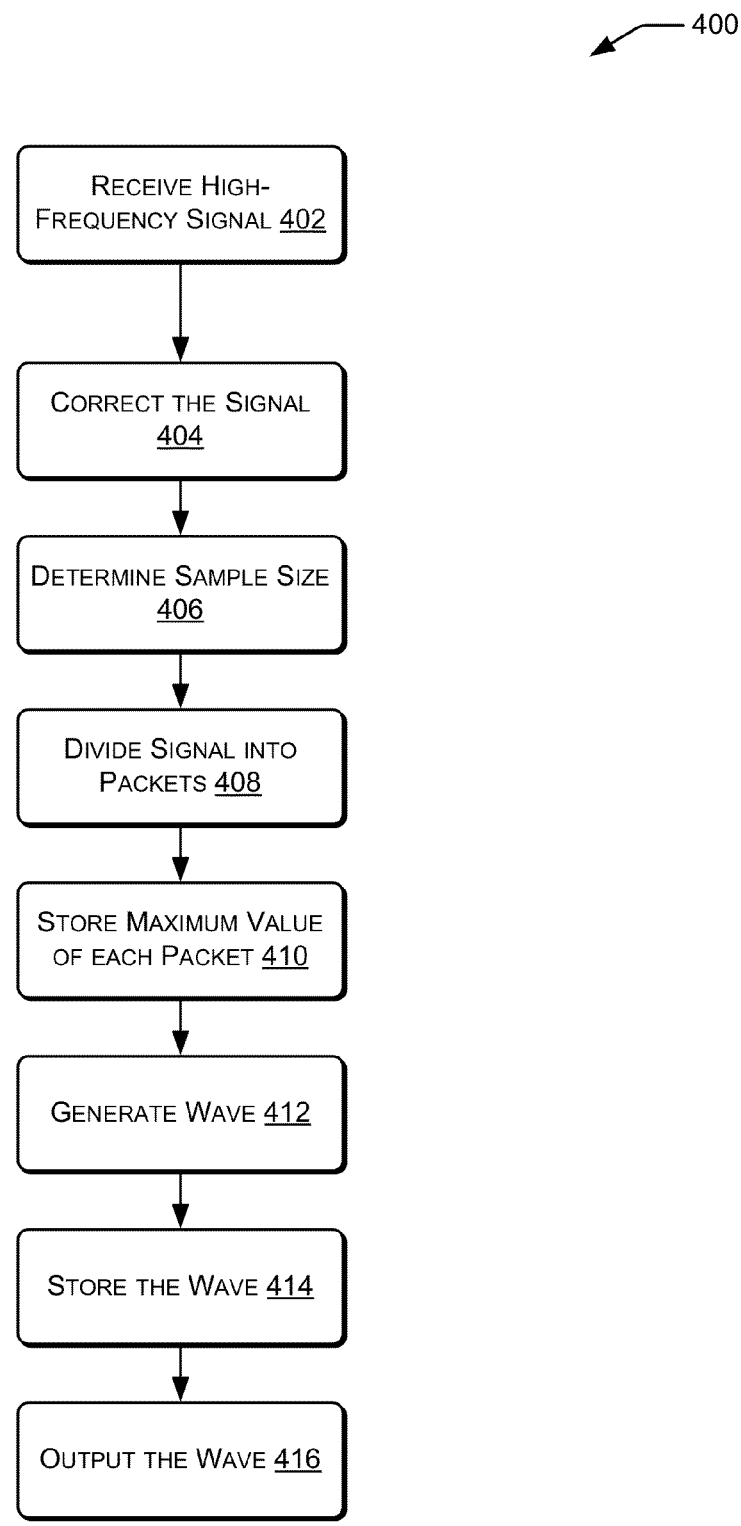
FIG. 4 is a flow diagram illustrating details of a method for compressing high-frequency signals, according to one embodiment.

FIG. 4 is an exemplary flow diagram illustrating details of a method for compressing a high-frequency signal. In one example, a computing device can perform any, some, or all of the operations of process 400. The process 400 is illustrated as a logical flow diagram, in which each operation represents a sequence of operations that can be implemented in hardware, software, or a combination thereof. In the context of software, the operations can represent computer-executable instructions stored on one or more computer-readable storage media that, when executed by one or more processors, perform the recited operations. Generally, computer-executable instructions can include routines, programs, objects, components, data structures, and the like that perform particular functions or implement particular abstract data types. The order in which the operations are described is not intended to be construed as a limitation, and any number of the described operations can be combined in any order and/or in parallel to implement the process.

In this particular implementation, the process 400 can begin at block 402, where a high-frequency signal can be received. In one embodiment, the high-frequency signal can be received from one or more sensors 102 by a signal conditioner 104, as shown in FIG. 1. A high-frequency signal can also be received by the signal receiving module 318 in FIG. 3. The high-frequency signal can be corrected by recording only a predefined portion of the high-frequency signal, such as the positive portion of the signal as noted above, at block 404. Such correction can be performed by one or more of the pre-amps 106, the filters 108, or the signal rectifiers 110, as illustrated and described in association with FIG. 1. The correction can also be performed by the signal correction module 320 illustrated in FIG. 3, in one embodiment.

A sample size for collecting a number of samples from the high-frequency signal, e.g., the corrected high-frequency signal, can be determined at block 406. The signal can also be divided into packets at block 408, and the maximum value of each of the packets can be stored at block 410. In one embodiment, the sample size determination, division of the signal into packets, and storing of the maximum value of the packets can be performed by the maximum detect and hold control interface 112, as illustrated and described in association with FIG. 1. In another embodiment, each of these processes can also be performed by the sample size determination module 322, as illustrated and described in association with FIG. 3.

A waveform can be generated at block 412. The waveform can be a lower frequency representation of the original, high-frequency signal without the high-frequency content. The generated waveform can be stored at block 414 and output at block 416. In one embodiment, the waveform can be generated, stored, and output by the maximum detect and hold control interface 112 as illustrated and described in association with FIG. 1. In another embodiment, each of these processes can be performed by the wave generation module 326, as illustrated and described in association with FIG. 3.

Illustrative systems and methods for the compression of high-frequency signals are described above. Some or all of these systems and methods may, but need not, be implemented at least partially by configurations such as those shown in FIGS. 1 and 3. It should be understood that certain acts in the methods may be rearranged, modified, and/or omitted entirely, depending on the circumstances. Also, any of the acts described above with respect to any method may be implemented by any number of processors or other computing devices based on instructions stored on one or more computer-readable storage media.

That which is claimed:

1. An apparatus, comprising:
   a switch, configured to receive at least one compressed signal, wherein the at least one compressed signal is created in part by compressing at least one measured signal;
   a modulator, coupled to the switch, configured to modulate the at least one compressed signal;
   a filter, coupled to the modulator, configured to filter the at least one measured signal;
   at least one memory, coupled to the modulator, configured to store the at least one compressed signal; and
   a maximum detect and hold control interface, coupled to at least one of the switch, the modulator, the filter, or the at least one memory, and configured to:
      control at least one of the switch, the modulator, the filter, or the at least one memory to compress the at least one measured signal, and
      divide the at least one compressed signal into at least two divisions based at least in part on a determined number of samples to be collected from a corrected signal.

2. The apparatus of claim 1, wherein the at least one measured signal is a high-frequency signal of at least approximately 100 kHz.

3. The apparatus of claim 1, wherein a signal rectifier is further configured to correct the at least one measured signal by recording only a predefined portion of the at least one measured signal.

4. The apparatus of claim 3, wherein the predefined portion of the at least one measured signal is a positive portion of the signal.

5. The apparatus of claim 1, wherein an amount of a plurality of packets is based at least in part on the at least two divisions.

6. The apparatus of claim 1, wherein the at least one compressed signal comprises an amplitude modulated sinusoidal waveform.

7. The apparatus of claim 1, wherein the maximum detect and hold control interface is further configured to at least one of store or output a waveform representing the at least one compressed signal.

* * * * *